United States Patent [19]

Urai

[11] Patent Number: 4,855,956

[45] Date of Patent: Aug. 8, 1989

[54] SEMICONDUCTOR MEMORY DEVICE WITH IMPROVED CELL ARRANGEMENT

[75] Inventor: Takahiko Urai, Tokyo, Japan

[73] Assignee: NEC Corporation, Tokyo, Japan

[21] Appl. No.: 103,312

[22] Filed: Oct. 1, 1987

[30] Foreign Application Priority Data

Oct. 1, 1986 [JP]  Japan .................. 61-234929

[51] Int. Cl.$^4$ ............................. G11C 7/02
[52] U.S. Cl. ...................... 365/210; 365/51
[58] Field of Search ............ 365/51, 63, 200, 210, 365/185

[56] References Cited

U.S. PATENT DOCUMENTS 4,393,474  7/1983  McElroy .................. 365/200

Primary Examiner—Joseph A. Popek
Attorney, Agent, or Firm—Sughrue, Mion, Zinn, Macpeak & Seas

[57] ABSTRACT

A semiconductor memory device having a plurality of memory cells of uniform and reliable characteristics is disclosed. The memory device comprises at least one array of memory cells arranged in matrix form of rows and columns and a selection circuit for accessing at least one of the memory cells, and is featured by a plurality of dummy cells arranged along all the peripheries of the array so as to surround the array.

6 Claims, 3 Drawing Sheets

SEMICONDUCTOR MEMORY DEVICE WITH IMPROVED CELL ARRANGEMENT

BACKGROUND OF THE INVENTION

The present invention relates to a semiconductor memory device fabricated on a semicondutor substrate.

Memory capacity of semiconductor memory devices have been increased remarkably according to the improvement in fine patterning technique in the semiconductor field. In a semiconductor memory, a plurality of memory cells are arranged in a matrix form of rows and columns, and such a matrix of memory cells are usually divided into two or more memory arrays. Each of the rows and each of the columns are designated by row address signals and column address signals, respectively in the matrix.

However, accompanied by reduction in patterns of circuit elements and increase in the memory capacity, control of the respective manufacturing steps has become critical and difficult and deviation or fluctuations in the respective circuit elements have become large and innegligible. For example, for the same circuit elements such as memory cells, there is deviation in characteristics among them according to their locations even they are formed on the same chip. Particularly, deviations of characteristics in memory cells in the same chip are determinant factor in the memory device. Namely, a read out signal from a memory cell is generally very small and a margin in a signal stored in a memory cell is also small, and therefore the deviation of the characteristics in memory cells are required to be within a predetermined range. Otherwise, one of the binary data stored in a certain memory cell is erroneously read out of sensed as the other of the binary data, resulting in a mulfunction. Therefore, it is desirable that the memory cells included in the same chip have the same characteristics with no deviation among them.

In general, it has been considered that comparative errors in sizes or dimensions in circuit elements formed in the same semiconductor chip are very small for the same kind of circuit elements irrespective of their respective locations. For example, a field effect transistor with a channel length 'k' and a field effect transistor with a channel length 'nk' (n being a positive integer) are accurately formed on the same semiconductor chip with ease. However, the inventor of the present invention has found the fact that memory cells at the peripheral portion of the memory cell array are generally inferior to the memory cells at the internal portion of the memory cell array in the electrical characteristics. Namely, each memory cell at the internal portion of the memory cell array is necessarily surrounded by other memory cells and therefore the memory cells at the internal portion of the memory array are subjected to the same process atmosphere. While, each memory cell at the peripheral portion of the memory cell array is not surrounded by other memory cells but in adjacent to other regions such as an isolation region or other elements. Therefore, the affection of process to the memory cells at the peripheral portion of the memory cell array is not uniform over the entire memory cells at the peripheral portion of the memory cell array.

Thus, the uniformity in formation of the memory cells at the peripheral portion of the memory cell array is lower that that in the memory cells at the internal portion of the memory cell array and the memory cells at the peripheral portion of the array determines the worst characteristics of the memory cell in the array.

SUMMARY OF THE INVENTION

It is an object of the present invention to provide a semiconductor memory device having an improved characteristics over all addressable memory cells.

The semiconductor memory device according to the present invention comprises at least one array of memory cells and an address circuit for selectively accessing at least one memory cell in the array in accordance with address information, and is featured in that dummy memory cells are provided to surround all the peripheries of the array.

According to the present invention, each memory cell in the array is surrounded by other memory cells or dummy cells and therefore, uniformity in process is established over all the memory cells in the array. While, the dummy cells are not formed uniformly, but they are not used as functional memory cells to be accessed.

Thus, according to the present invention, all the memory cells to be accessed have the uniform and reliable characteristics and the memory device having a high reliability can be obtained.

DETAILED DESCRIPTION OF THE INVENTION

Figure 1:
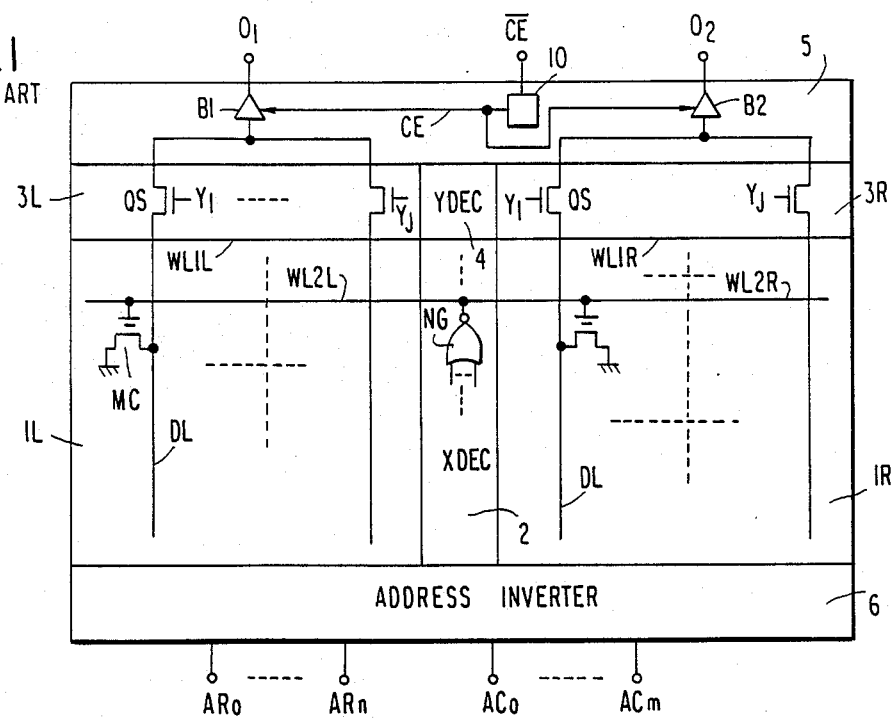
FIG. 1 is a schematic block diagram of a semiconductor memory device according to a prior art.

Referring to FIG. 1, a semiconductor memory device according to a prior art is explained.

Two memory cell arrays 1L and 1R are provided at both side of a row decoder (X DEC) 2 which includes a plurality of NOR gates receiving true and complementary signals of row address signals $AR_0$ to $AR_n$ generated by an address inverter block 6. An output of each of the NOR gates NG is coupled to one word line e.g. WL2L in the left side array 1L and to one word line e.g. WL2R in the right side array. A plurality of digit lines EL are arranged in both of the arrays 1L and 1R and a plurality of memory cells MC are arranged at the respective intersections of the word lines and the digit lines. In this case, each of the memory cells includes a floating gate type field effect transistor with a control gate connected to one of the word lines, a drain connected to one of the digit lines and a source connected to a ground potential source. A column decoder (Y DEC) 4 receives true and complementary signals of column address signals $AC_0$ to $AC_m$ generated by the address inverter block 6 to generate column decode signals $Y_1$ - $Y_J$. Columns selection circuits 3L and 3R includes a plurality of transfer gates Qs coupled between the digit lines and inputs of output amplifiers B1 and B2 included in a peripheral circuit block 5 which also includes a control circuit 10 generating a control signal CE for enabling the output amplifiers B1 and B2 and other control signals (not shown) for controlling the respective portions in a known way.

In the memory device of FIG. 1, all the memory cells in both of the arrays are essential storage bits consisting of a total memory capacity e.g. 64 K bits of the memory device and are selectable in accordance with row and column address signals.

Thus, in the arrays 1L and 1R, all the memory cells including those along the peripheries of the arrays 1L and 1R are used to store data and the memory cells along the peripheries of the arrays 1L and 1R are inferior to those memory cells at the internal portions of the arrays 1L and 1R. Therefore, the yield of the memory devices has been lowered by the memory cells at the peripheral portions.

Figure 2:
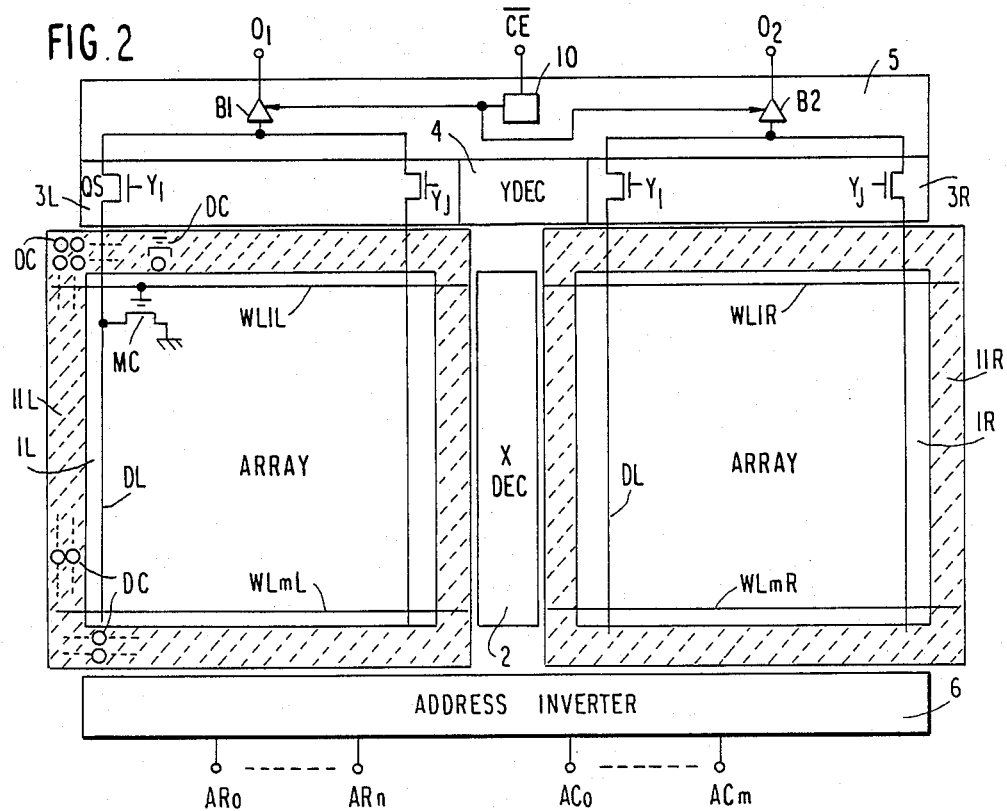
FIG. 2 is a schematic block diagram of a semiconductor memory device according to one preferred embodiment of the present invention.
Figure 3:
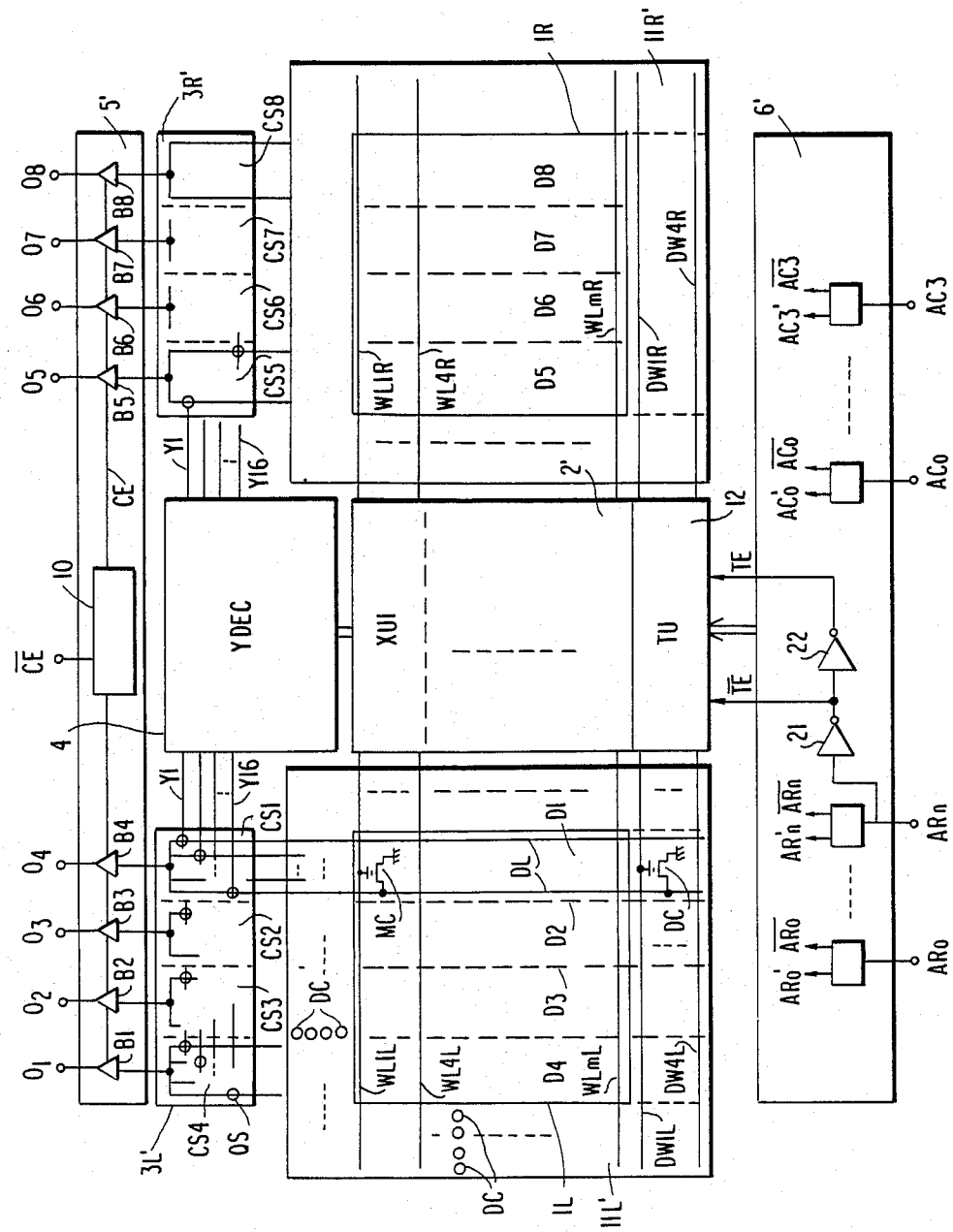
FIG. 3 is a schematic block diagram showing another embodiment of the present invention.

Referring to FIG. 2, a semiconductor memory device according to one embodiment of the present invention is explained.

In FIG. 2, the portions corresponding to those in FIG. 1 are designated by the same reference numerals as those in FIG. 1.

Each of the memory cell arrays 1L and 1R has a plurality of memory cells arranged m rows and J columns as is the case in FIG. 1

According to the present invention, a plurality of dummy cells are arranged along the all four peripheries of the array 1L and all four peripheries of the array 1R, as illustrated by the references 11L and 11R, respectively. Each of the dummy cells has the same structure as the memory cell MC and is not connected to the word line and the digit line. In this embodiment, the dummy cells DC are arranged in two rows or two columns and two dummy cells are provided in the width of the dummy cell areas 11L and 11R.

Any of the dummy cells DC are not selected by the row decoder 2 and the column decoder 4, and the dummy cells DC do not have function to store data.

According to the present embodiment, the memory cells MC are formed together with the dummy cells DC at the peripheries of the memory cells in each of the arrays 1L and 1R, and therefore as a whole, none of the memory cells is disposed at the peripheral portions in the arrangements of the memory cells and dummy cells.

Accordingly, each of the memory cells is surrounded by other memory cells or the dummy cells having the same structure as the memory cells and therefore all the memory cells are formed with the desirable uniformity in characteristics. While deviations or fluctuations in characteristics are absorbed into the arrangements 11L and 11R of the dummy cells. Thus, by providing the dummy cells along all the peripheries of the memory arrays, all the memory cells in the memory arrays can be formed with desirable characteristics.

Referring to FIGS. 3 to 6, a semicondcutor memory device according to another preferred embodiment is explained.

In this embodiment, 64 digit lines are arranged in each of the memory array 1L and 1R. The digit lines are divided into four digit groups D1 to D4 in the array 1L and four digit groups D5 to D8 in the array 1R. Each of the digit groups includes 16 digit lines.

The digit lines of the groups D1 to D4 in the array 1L are connected to column selection units CS1 to CS4 in the column selection circuit 3L', respectively. The digit lines of the digit groups D5 to D8 are connected to colunn selection units CS5 to CS8 in the column selection circuit 3R', respectively. Each of the column selection units CS1 to CS8 includes sixteen transfer gates Qs coupled between the digit lines and inputs of eight output amplifiers B1 to B8, as illustrated.

The sixteen transfer gates in the respective column selection units are selected by the column decode signals $Y_1$ to $Y_{16}$ which are generated by the column decoder (Y DEC) 4 in accordance with the true and complementary signals ($AC'_0$, $A\overline{AC}_0$ -$\overline{AC}_3$, $\overline{AC}_3$) of the column address signals $AC_0$ -$AC_3$ by the address inverter block 6'. The eight output amplifiers B1 to B8 produce read signals to output terminals in response to an active (high) level of a control signal CE generated by the control circuit when a chip enable signal $\overline{CE}$ is at a low level.

In the embodiment, four rows of dummy cells DC are arranged along the upper and bottom peripheries of the arrays 1L and 1R and four columns of the dummy cells are arranged along the left side and right side peripheries of the arrays 1L and 1R, as illustrated by the references 11L' and 11R', respectively.

The arrangement of the dummy cells along the bottom periphery of the array 1L are connected to four dummy word lines DW1L to DW4L and the digit lines of the array 1L. Similarly, the dummy cells arranged along the bottom periphery of the array 1R are connected to four dummy word lines DW1R to DW4R and the digit lines of the array 1R.

The dummy word lines DW1L to DR4L in the arrangement 11L' and the dummy word lines DW1R to DW4R are selected by a test circuit (TU) 12.

Figure 5:
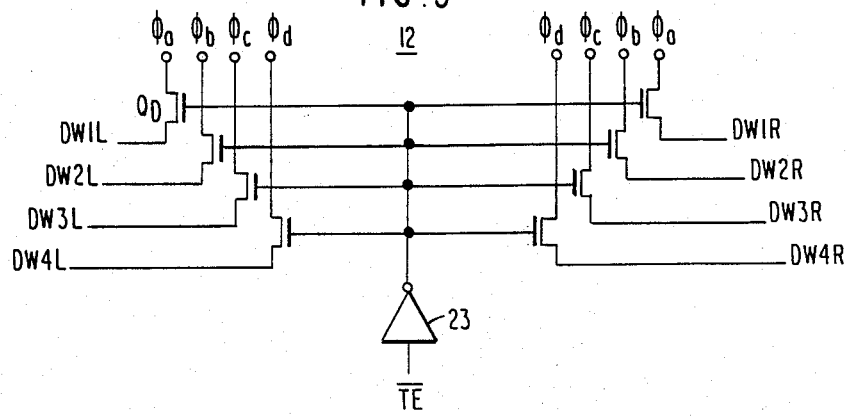
FIG. 5 is a schematic circuit diagram of a test circuit of FIG. 3.

A detailed structure of the test circuit 12 is shown in FIG. 5. The test circuit 12 includes an inverter 23 receiving a test enable signal $\overline{TE}$ and source-follower transistors $Q_D$ coupled between the respective dummy word lines and selective drive signals $\phi a$, $\phi b$, $\phi c$ and $\phi d$. The selective drive signals are produced by decoding lower two bits of row address signals $AR_0$ and $AR_1$ and one of the signal $\phi a$-$\phi d$ takes a high level with remaining three signals at a low level. For example, when $\overline{TE}$ is at a low level and $\phi a$ is at a high level, the dummy word lines DW1L and DW1R are selected.

The test enable signal $\overline{TE}$ is generated by a test mode detecting inverter 21 having an input coupled to $AR_n$. The inverter 21 has a high value of threshold voltage e.g. 15 V which is larger than a power supply voltage Vcc e.g. 5 V, and produces a low level of $\overline{TE}$ only when the voltage of $AR_n$ is larger than the above high value of threshold voltage, and otherwise produces a high level of $\overline{TE}$. An inverter 22 has a normal range of threshold voltage e.g. 2.5 V and generates a control signal TE as the inverted signal $\overline{Te}$.

Figure 6:
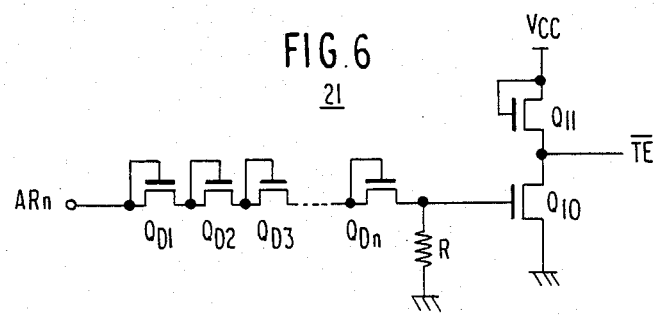
FIG. 6 is a schematic circuit diagram of a test mode detecting inverter of FIG. 3.

An example of the inverter 21 is shown in FIG. 6. A plurality of diode-connected field effect transistors $Q_{D1}$ -$Q_{Dn}$ are connected in series between a gate of a drive transistor $Q_{10}$ and $AR_n$ to obtain a predetermined high value of threshold voltage.

The row decoder 2' selects one of the word lines WL1L-WLmL in the array 1L and one of the word lines WL1R-WLmR in the array 1R in accordance with the row address signals $AR_0$-$AR_n$, and includes a plurality of decode units (XU1 . . . . ) each coupled to consecutive four word lines in the array 1L and consecutive four word lines in the array 1R.

Figure 4:
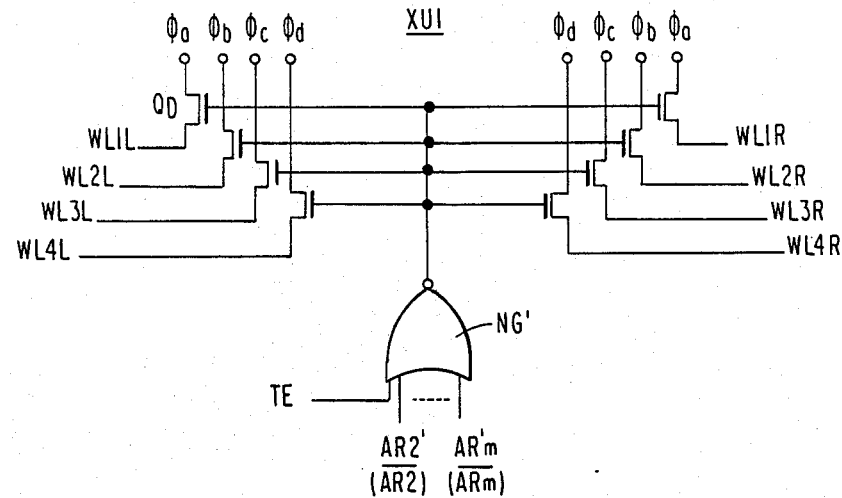
FIG. 4 is a schematic circuit diagram of a part of the row decoder.

One of the decode units XU1 is shown in FIG. 4. The decoding unit XU1 includes a NOR gates NG' receiving the control signal TE and true or complementary row address signals of $AR_2$-$AR_n$. When TE and all the address signals inputted are low in level, the output of the gate NG' is at a high level so that one of $\phi a - \phi d$ of the high level is transmitted to the dummy word lines e.g. WL1L and WL1R.

When the signal $AR_n$ is within the normal signal range (e.g. 0-5 V), the signal TE is at a low level and the row decoder 2' selects one of the word lines WL1L-WLmL and one of the word lines WL1R-WLmR and the column decoder selects one of the decode signals $Y_1 - Y_{16}$. Thus, four-bits data are selected by the circuit 3L' and outputted to the output terminals $O_1 - O_4$ via the amplifiers B1-B4 and four-bits data are similarly selected by the circuit 3R' and outputted to the output terminals $O_5 - O_8$ via the amplifiers B5-B8. In this case, the memory cells in the arrays 1L and 1R are accessed and the dummy cells are not accessed. It is also apparent that the memory cells in the arrays 1L and 1R have the superior and uniform characteristics as compared to the dummy cells.

In a test mode, the level of $AR_n$ is brought to about 15 V or more and the inverter 21 generates the low level of $\overline{TE}$ so that the test circuit 12 selects one of the dummy word lines in the arrangement 11L' and one of the dummy word lines in the arrangement 11R'. Therefore, sixteen dummy cells coupled to the selected dummy word line in the arrangement 11L' produce read signal to the digit lines in the array 1L and the sixteen dummy cells coupled to the dummy word line in the arrangement 11R' produce read signals to the digit lines in the array 1R.

Then, four read signals are outputted to $O_1 - O_4$ via the selection circuit 3L' and the amplifiers B1-B4 with respect to the arrangement 11L' and four read signals are outputted to the output terminals $O_5 - O_8$ via the selection circuit 3R' and the amplifiers B5-B8 with the arrangement 11R'.

There is a tendency that the dummy cells show worse electrical characteristics than the memory cells. Therefore, the worst access time of the memory cells in the arrays 1L and 1R can be estimated by measuring access time of the dummy cells from the activation of the test circuit to the appearance of data at the output terminals $O_1 - O_8$ in the test mode.

Although, the present invention has been explained in case of programmable read only memory of floating gate type, but the present invention is also applicable to variety of semiconductor memory devices such as random access memories.

I claim:

1. A semiconductor memory device comprising means receiving address information consisting of N bits (N being a positive integer), an array of memory cells arranged in a matrix form of rows and columns, each of said memory cells having the same structure, the number of said memory cells in said array being larger than $2^N$, said memory cells in said array being divided into a peripheral group and an internal group, the memory cells of said internal group being completely surrounded by the memory cells of said peripheral group, so that all peripheries of each memory cell of said internal group are completely surrounded by other memory cells, the number of said internal groups of memory cells being said $2^N$ or less and a selection circuit coupled to said receiving means and said internal group of memory cells without being connected to said peripheral group of memory cells for selectively accessing only said internal group of memory cells in accordance with said address information.

2. The memory device according to claim 1, further comprising at least one dummy word line coupled to a part of said internal group of cells and means for operatively activating said dummy word line irrespective of said address information.

3. The memory device according to claim 1, in which each of said memory cells include a floating gate type field effect transistor.

4. A semiconductor memory device comprising an array of memory cells arranged in a matrix form of rows and columns with four peripheries, a plurality of dummy cells arranged along all of said four peripheries of said array, each of said dummy cells having substantially the same configuration as each of said memory cells, address means for receiving address information, and a selection circuit coupled to said address means and said array for selectively accessing at least one memory cell of only said array of memory cells, all of said dummy cells being not coupled to said selection circuit and not capable of selection by said selection circuit, whereby each of said array of memory cells to be accessed by said selection is completely surrounded by other memory cells of said array or other memory cells of said array and said dummy cells.

5. The memory device according to claim 4, in which each of said memory cells and each of said dummy cells includes a floating gate type field effect transistor.

6. The memory device according to claim 4, further comprising at least one dummy word line coupled to a part of said dummy cells and means coupled to said dummy word line for operatively activating said at least one dummy word line irrespective of said address information.

* * * * *

UNITED STATES PATENT AND TRADEMARK OFFICE
CERTIFICATE OF CORRECTION

PATENT NO. : 4,855,956

DATED : August 8, 1989

INVENTOR(S) : Urai

It is certified that error appears in the above-identified patent and that said Letters Patent is hereby corrected as shown below:

Column 2, line 54, delete "EL" and insert --DL--,

Column 4, line 9, delete "$A\overline{AC_o} - \overline{AC_3}$," and insert therefor --$\overline{AC_o} - AC'_3$--, Signed and Sealed this Twelfth Day of February, 1991

*Attest:*

HARRY F. MANBECK, JR.

*Attesting Officer*     *Commissioner of Patents and Trademarks*

US004855956C1

(12) EX PARTE REEXAMINATION CERTIFICATE (7474th)

United States Patent
Urai

(10) Number: US 4,855,956 C1
(45) Certificate Issued: May 4, 2010

(54) SEMICONDUCTOR MEMORY DEVICE WITH IMPROVED CELL ARRANGEMENT

(75) Inventor: Takahiko Urai, Tokyo (JP)

(73) Assignee: NEC Electronics Corporation, Nakahara-Ku, Kawasaki, Kanagawa (JP)

Reexamination Request:
No. 90/009,033, Feb. 11, 2008

Reexamination Certificate for:
Patent No.: 4,855,956
Issued: Aug. 8, 1989
Appl. No.: 07/103,312
Filed: Oct. 1, 1987

Certificate of Correction issued Feb. 12, 1991.

(51) Int. Cl.
*G11C 17/08* (2006.01)
*G11C 17/12* (2006.01)
*H01L 27/105* (2006.01)

(52) U.S. Cl. .................. 365/185.1; 365/210.1; 365/51; 257/E27.081

(58) Field of Classification Search .................. None
See application file for complete search history.

(56) References Cited

U.S. PATENT DOCUMENTS 4,393,474 A  7/1983  McElroy ................ 365/185.09
4,731,642 A * 3/1988  Katto et al. ................. 257/296

FOREIGN PATENT DOCUMENTS

| EP | 0 145 488 A2 | 6/1985 |
| GB | 2156581 | 10/1985 |
| JP | 54-066042 | 5/1979 |
| JP | 60-59599 | 4/1985 |

OTHER PUBLICATIONS

"MOS/LSI Design and Application," Carr, W.N. and Mize, J.P.; ed. by Sawyer, R.E. and Miller, J.H., New York enz., McGraw–Hill, 1972; *Texas Instruments Electronics Series*.
"Interlaced Access of High Density memory Arrays," J.P. Streck, *IB Technical Disclosure Bulletin*, vol. 23, No. 11, Apr. 1981; pp. 4858–4859.
European Search Report, Nov. 25, 1987.

\* cited by examiner

*Primary Examiner*—Pia Tibbits

(57) ABSTRACT

A semiconductor memory device having a plurality of memory cells of uniform and reliable characteristics is disclosed. The memory device comprises at least one array of memory cells arranged in matrix form of rows and columns and a selection circuit for accessing at least one of the memory cells, and is featured by a plurality of dummy cells arranged along all the peripheries of the array so as to surround the array.

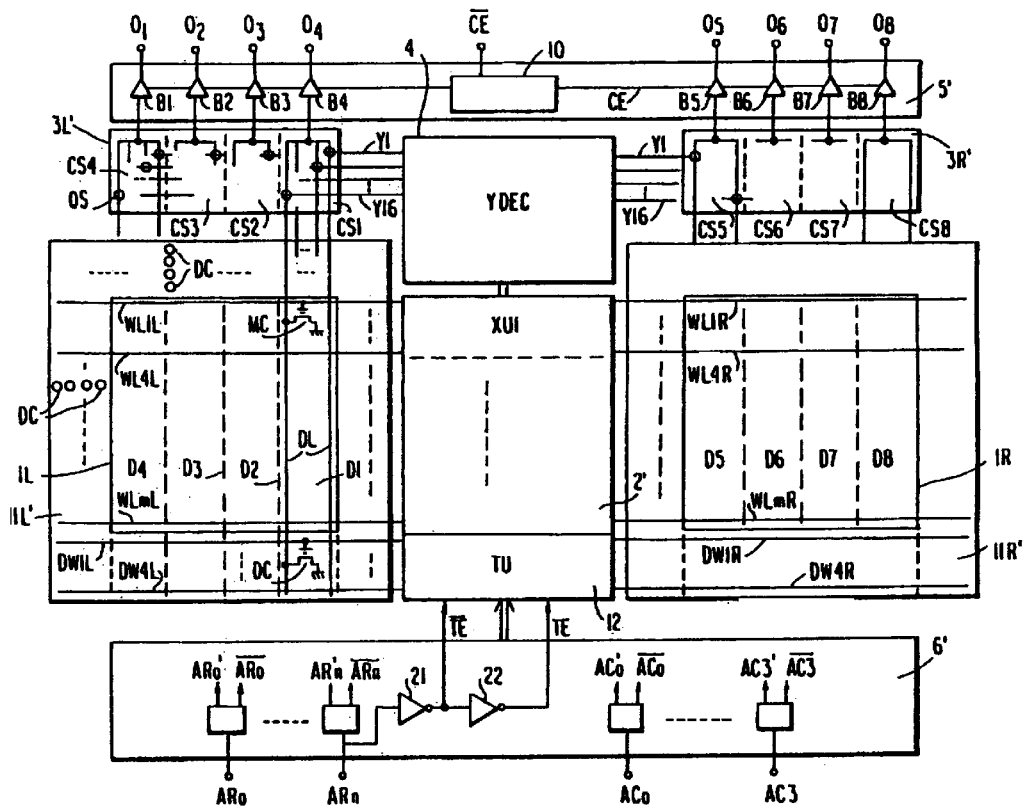

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

The patentability of claims 4 and 5 is confirmed.

Claims 1–3 and 6 are cancelled.

* * * * *